(12) United States Patent
Suzuki et al.

(10) Patent No.: US 7,575,854 B2
(45) Date of Patent: Aug. 18, 2009

(54) METHOD FOR MANUFACTURING MICROLENS

(75) Inventors: Katsutoshi Suzuki, Tokyo-to (JP); Masaaki Kurihara, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 0 days.

(21) Appl. No.: 11/828,489

(22) Filed: Jul. 26, 2007

(65) Prior Publication Data
US 2008/0090182 A1 Apr. 17, 2008

(30) Foreign Application Priority Data
Jul. 27, 2006 (JP) ............... 2006-204782

(51) Int. Cl.
*H01L 27/14* (2006.01)
*G02B 3/00* (2006.01)
(52) U.S. Cl. ....................... 430/321; 430/394
(58) Field of Classification Search ............... None
See application file for complete search history.

(56) References Cited

U.S. PATENT DOCUMENTS

2005/0105188 A1* 5/2005 Hayashi et al. ............ 359/619

FOREIGN PATENT DOCUMENTS

| JP | 2002-076315 | | 3/2002 |
| JP | 2004-310077 | A * | 11/2004 |
| JP | 2005-258349 | | 9/2005 |
| WO | WO 2005/008781 | A1 * | 1/2005 |

OTHER PUBLICATIONS

Computer-generated translation of JP 2004-310077 (Nov. 2004).*

* cited by examiner

*Primary Examiner*—John A. McPherson
(74) *Attorney, Agent, or Firm*—Ladas & Parry LLP

(57) ABSTRACT

A main object of the present invention is to provide a method for manufacturing a microlens that can easily form a microlens having a smooth shape, in which a maximum thickness position is different from a gravity center position. To attain the object, the present invention provides a method for manufacturing a microlens comprising processes of: a basic shape forming-exposure process for performing exposure by using a microlens basic shape-forming mask to a photosensitive resin layer formed on a substrate; and a deforming-exposure process for performing exposure, with a unit cell-exposure profile different from that of the exposure performed in the basic shape forming-exposure process, to the photosensitive resin layer by using a microlens-shape-adjusting mask, wherein a microlens, having a maximum thickness position different from a gravity center position is formed.

2 Claims, 10 Drawing Sheets

Exposure Profile

Unit Cell-Exposure Profile of Unit Cell α

Exposure Profile (Defocus Exposure)

Unit Cell-Exposure Profile of Unit Cell α

Overlap of Exposure Profiles

Unit Cell-Exposure Profile of Unit Cell α

Exposure Profile

Exposure Profile

METHOD FOR MANUFACTURING MICROLENS

BACKGROUND OF THE INVENTION

1. Field of the Invention

The present invention relates to a method for manufacturing a microlens that can easily form a microlens having a smooth shape, in which a maximum thickness position is different from a gravity center position.

2. Description of the Related Art

A solid-state image sensor, such as a CCD (Charge Coupled Device) or a CMOS (Complementary Metal Oxide Semiconductor) sensor, which converts the subject light into optical signals in order to record images, is provided in a main body of a digital camera that has been widely used in recent years. In general, the solid-state image sensors comprise light receiving elements that receive and convert the subject light into photoelectric signals, color filters formed on the light receiving elements, and microlenses that improve light collection efficiency in the light receiving elements.

The microlens is very useful in terms of improving light collection efficiency in the light receiving element. However, since the microlens is provided, noise or shading is considerably generated on occasion and therefore becomes problematic. Specifically, when oblique light is thrown on the microlens, light collection is insufficient in the light receiving element as compared to when light is thrown on the microlens in a vertical direction. As a result, difference in light collection occurs between pixels, which causes difference in signal output, and noise is occasionally generated due to output variation. For example, difference in signal output is caused by the oblique light at a central portion and a peripheral portion thereof in each of the pixels. In this case, there is a possibility that the signal output in the peripheral portion of each pixel is smaller than that in the central portion of each pixel. This difference in signal output occasionally causes shading on a screen on which images are displayed.

There has been known an image sensor in which a plurality of light receiving elements share a signal reading circuit for the purpose of high integration, that is, so-called an image sensor having plural pixel sharing structure. However, due to its structural restriction, a central position of the microlens occasionally does not correspond to a central position of the light receiving element in a plan view in the image sensor. For this reason, problems such as noise and shading are caused.

A microlens having a rotationally asymmetrical shape, which is different from the conventional microlens having a rotationally symmetrical shape, has been proposed to solve the above-mentioned problems. That is, an attempt that the microlens having a rotationally asymmetrical shape is used to obtain uniform light collection in the light receiving element and to suppress the problems such as noise and shading.

A method for forming a microlens has been proposed in Japanese Patent Application Laid-Open (JP-A) No. 2002-76315. According to the method, lattice patterns are formed to be asymmetry to a center of a unit cell, a material of the lens is applied and then patterned, and a thermal flow is performed, in order to form a microlens having a rotationally asymmetrical shape. However, according to JP-A No. 2002-76315, the microlens is formed using the thermal flow. For this reason, it is difficult to accurately form a lens having a desired shape.

Meanwhile, a method for forming a microlens has been proposed in JP-A No. 2005-258349. In the method, a double exposure is performed using a gray-scale mask and a corrective aperture mask to form a microlens having a desired shape. However, a rotationally asymmetrical microlens has not been described in JP-A No. 2005-258349.

SUMMARY OF THE INVENTION

In view of the above-mentioned problems, the present invention has been achieved. A main object of the present invention is to provide a method for manufacturing a microlens that can easily form a microlens having a smooth shape, in which a maximum thickness position is different from a gravity center position.

To attain the object, the present invention provides a method for manufacturing a microlens comprising processes of: a basic shape forming-exposure process for performing exposure by using a microlens basic shape-forming mask to a photosensitive resin layer formed on a substrate; and a deforming-exposure process for performing exposure, with a unit cell-exposure profile different from that of the exposure performed in the basic shape forming-exposure process, to the photosensitive resin layer by using a microlens-shape-adjusting mask, wherein a microlens, having a maximum thickness position different from a gravity center position is formed.

According to the present invention, two exposure processes having different unit cell-exposure profiles are performed. Accordingly, it is possible to easily form a microlens which has a maximum thickness position different from a gravity center position.

In the present invention, the microlens basic shape-forming mask is preferably a gray-scale mask, which has transmittance distribution rotationally symmetry to a central position of a unit cell. This is because the gray-scale mask has excellent versatility.

In the present invention, the microlens-shape-adjusting mask is preferably a mask provided with an opening part not having gradation properties, and the exposure performed in the deforming-exposure process is defocus exposure. The reason for this is as follows: a mask provided with an opening part which does not have gradation properties can be easily manufactured, and it is possible to obtain a microlens having a smooth shape by performing defocus exposure.

The present invention can achieve an advantageous effect of enabling to easily manufacture a microlens having a smooth shape, in which a maximum thickness position is different from a gravity center position.

DESCRIPTION OF THE PREFERRED EMBODIMENTS

Hereinafter, the method for manufacturing a microlens of the present invention will be explained.

The method for manufacturing a microlens of the present invention comprises processes of: a basic shape forming-exposure process for performing exposure by using a microlens basic shape-forming mask to a photosensitive resin layer formed on a substrate; and a deforming-exposure process for performing exposure, with a unit cell-exposure profile different from that of the exposure performed in the basic shape forming-exposure process, to the photosensitive resin layer by using a microlens-shape-adjusting mask, wherein a microlens, having a maximum thickness position different from a gravity center position is formed.

Figure 1A:
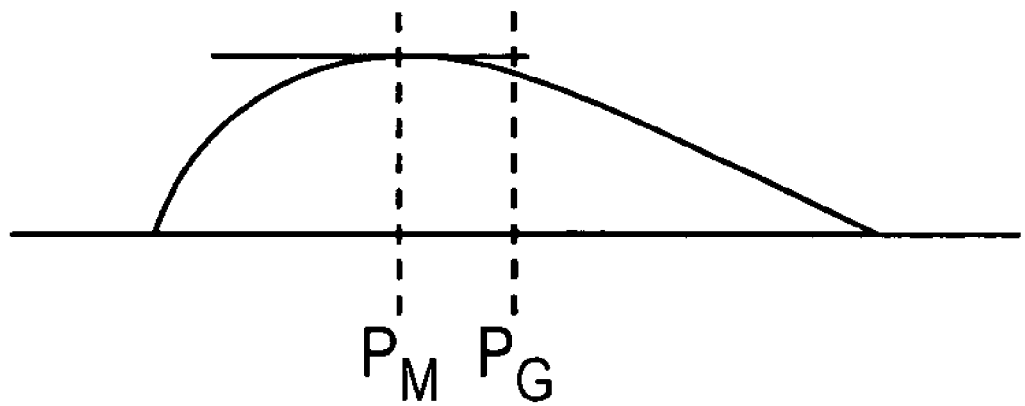
FIGS. 1A and 1B are views each explaining a shape of a microlens.
Figure 1B:
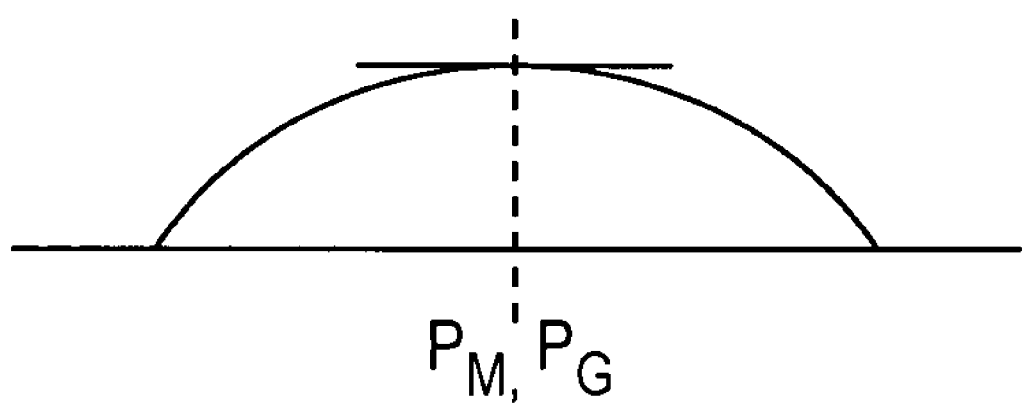

In the present invention, a "maximum thickness position" designates a position where a film thickness of a microlens is maximal. Further, a "gravity center position" designates a gravity center position of a contact surface where a microlens contacts with a substrate. A microlens, which has a maximum thickness position different from a gravity center position, designates a microlens which has a maximum thickness position $P_M$ different from a gravity center position $P_G$ as shown in FIG. 1A. Further, as shown in FIG. 1B, a conventional microlens has a maximum thickness position $P_M$ corresponding to a gravity center position $P_G$.

According to the present invention, since two exposure processes having different unit cell-exposure profiles are performed, it is possible to easily form a microlens which has a maximum thickness position different from a gravity center position. Further, since a microlens having a maximum thickness position different from a gravity center position is formed, it is possible to obtain a solid-state image sensor, in which the above-mentioned noise and shading are suppressed. Furthermore, the shape of a microlens is generally controlled by an exposure process in the method for manufacturing a microlens according to the present invention. For this reason, it is possible to form a microlens more accurately compare to a conventional method for forming a microlens by a thermal flow.

The method for manufacturing the microlens according to the present invention can be broadly classified into the following two embodiments depending on the order of performing the basic shape forming-exposure process and the deforming-exposure process. That is, the method for manufacturing the microlens can be broadly classified into: one embodiment (first embodiment), in which a basic shape forming-exposure process is performed before a deforming-exposure process, and the other embodiment (second embodiment), in which a deforming-exposure process is performed before a basic shape forming-exposure process. The embodiments will be described below.

1. First Embodiment

First, a method for manufacturing a microlens according to a first embodiment of the present invention will be described. In a method for manufacturing a microlens according to a first embodiment, a basic shape forming-exposure process is performed first and a deforming-exposure process is performed subsequently. That is, the method for manufacturing the microlens according to the first embodiment comprises: a basic shape forming-exposure process for performing exposure on a photosensitive resin layer formed on a substrate by using a microlens basic shape-forming mask, and a deforming-exposure process for performing exposure, which has a unit cell-exposure profile different from that of the exposure performed in the basic shape forming-exposure process, to the photosensitive resin layer by using a microlens-shape-adjusting mask after the basic shape forming-exposure process, wherein a microlens, which has a maximum thickness position different from a gravity center position, is formed.

Figure 2A:
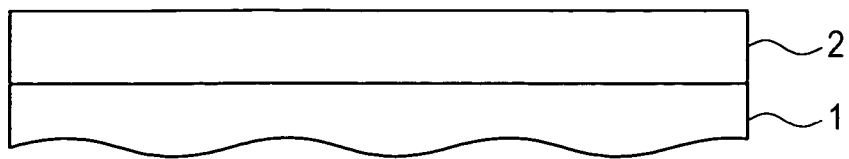
FIGS. 2A to 2D are process drawings showing a method for manufacturing a microlens according to an embodiment of the present invention.
Figure 2B:
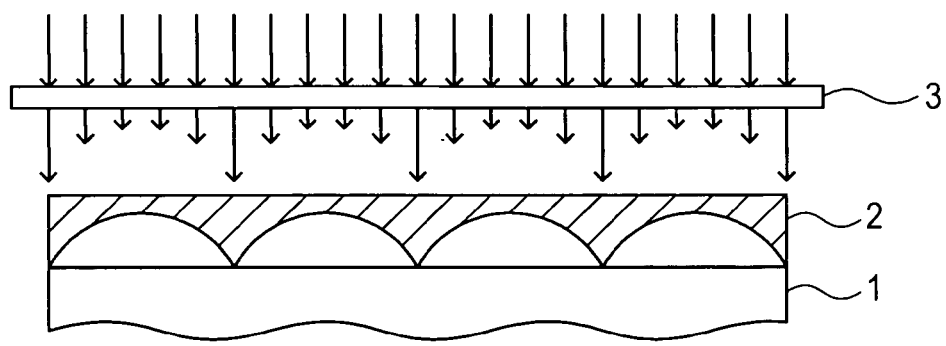
Figure 2C:
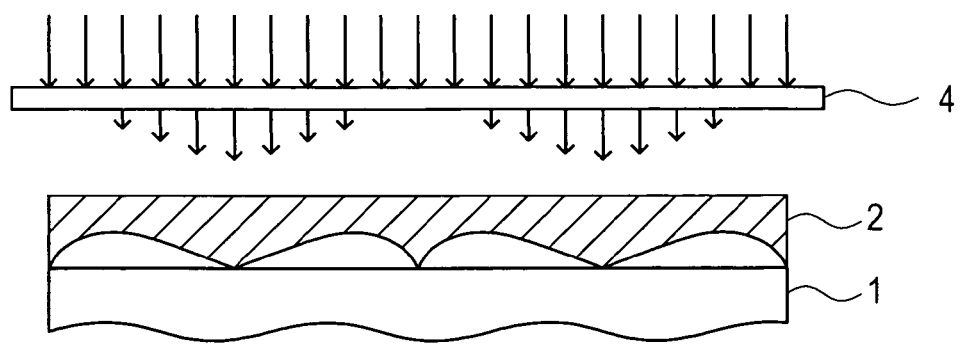
Figure 2D:

The method for manufacturing the microlens according to the first embodiment will be described below with reference to the drawings. FIGS. 2A to 2D are process drawings showing the method for manufacturing the microlens according to the first embodiment. The method for manufacturing the microlens shown in FIGS. 2A to 2D comprises: a photosensitive resin layer forming process for forming a positive type-photosensitive resin layer 2 on a substrate 1 as shown in FIG. 2A; a basic shape forming-exposure process for performing exposure to form a basic shape of a microlens by using a gray-scale mask, which has transmittance distribution rotationally symmetry to a central position of a unit cell, as a microlens basic shape-forming mask 3 as shown in FIG. 2B; and a deforming-exposure process for performing partial-exposure to the photosensitive resin layer 2 by using a microlens-shape-adjusting mask 4 as shown in FIG. 2C. Then, a developing process is performed. As a result, as shown in FIG. 2D, it is possible to obtain a microlens 5 that has a maximum thickness position different from a gravity center position.

Figure 3A:
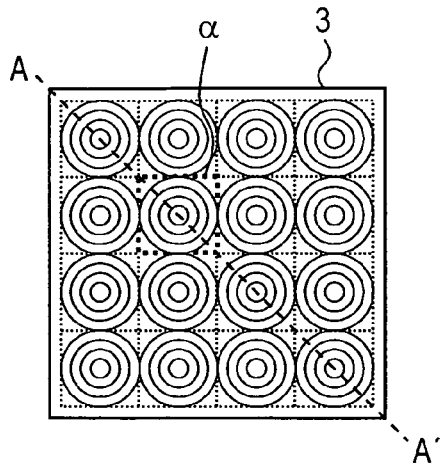
FIGS. 3A to 3F are views explaining masks and exposure profiles used in the method for manufacturing the microlens shown in FIGS. 2A to 2D.
Figure 3B:
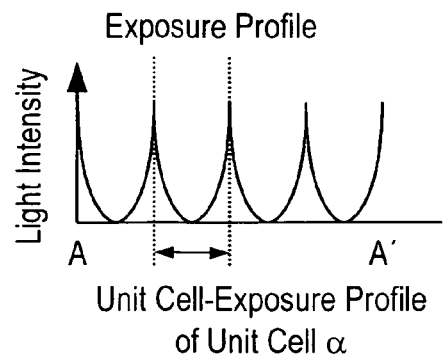

FIGS. 3A to 3F are views explaining the masks and exposure profiles used in the method for manufacturing the microlens shown in FIGS. 2A to 2D. FIG. 3A is a schematic plan view of the microlens basic shape-forming mask 3 shown in FIG. 2B, and shows a gray-scale mask that has transmittance distribution rotationally symmetry to a central position of a unit cell. Specifically, the microlens basic shape-forming mask is a gray-scale mask for a positive type-photosensitive resin layer, in which light shielding properties increase toward a central position of a unit cell. Further, FIG. 3B is a view showing the exposure profile in a cross-sectional view taken along a line A-A' of FIG. 3A. In FIG. 3B, a unit cell-exposure profile of a unit cell "α" in the basic shape forming-exposure process is exemplified as a unit cell-exposure profile.

Figure 3C:
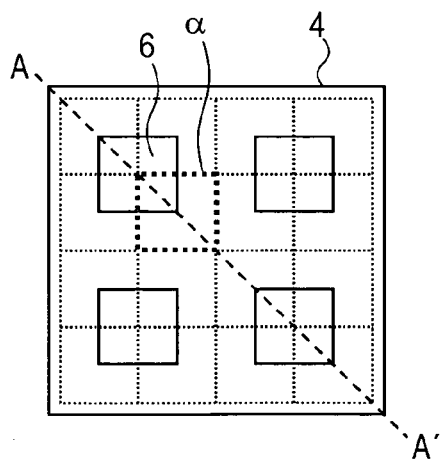
Figure 3D:
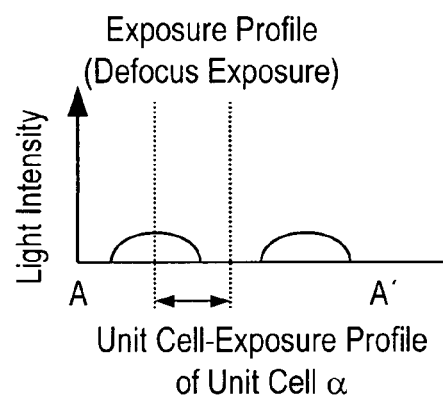
Figure 3E:
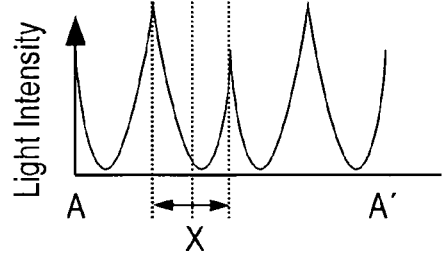
Figure 3F:
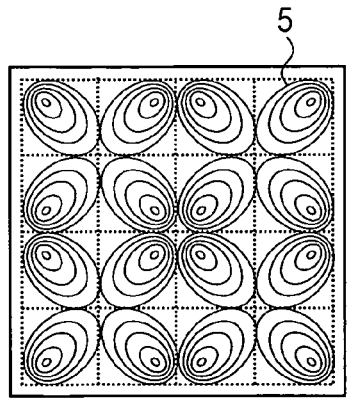

Meanwhile, FIG. 3C is a schematic plan view of the microlens-shape-adjusting mask 4 shown in FIG. 2C, and shows a mask having a plural number of rectangular opening parts 6. FIG. 3D is a view showing the exposure profile in a cross-sectional view taken along a line A-A' of FIG. 3C. However, FIG. 3D shows an exposure profile when defocus exposure to be described below has been performed. In FIG. 3D, a unit cell-exposure profile of a unit cell "α" in the deforming-exposure process is exemplified as a unit cell-exposure profile. As understood from the comparison between FIG. 3B and FIG. 3D, the two exposure with different unit cell-exposure profiles are performed in this embodiment. For this reason, as shown in FIG. 3E, the overlap of two different unit cell-exposure profiles shows rotationally asymmetry to a central position (center line "X") of a unit cell. As a result, as shown in FIG. 3F, it is possible to obtain a microlens 5 that has a maximum thickness position different from a gravity center position. Meanwhile, the "unit cell" designates a unit region on a substrate in which an individual microlens is formed, and generally has a rectangular shape. Further, the "central position of the unit cell" designates a position corresponding to an intersection between diagonal lines of the unit cell.

The method for manufacturing the microlens according to this embodiment generally comprises: a photosensitive resin layer forming process for forming a photosensitive resin layer on a substrate, a basic shape forming-exposure process, a deforming-exposure process, and a developing process. Each of the processes will be described below.

(1) Photosensitive Resin Layer Forming Process

First, the photosensitive resin layer forming process according to this embodiment will be described. The photosensitive resin layer forming process is a process for forming a photosensitive resin layer on a substrate. The photosensitive resin layer is a layer that is to be formed as a microlens by performing an exposure process and a developing process which will be described later.

The substrate differs depending on the application of the microlens or other factors. However, for example, a transparent glass substrate, such as quartz glass, alkali-free glass, or lead glass (soda lime glass), can be used as the substrate. Further, a solid-state image sensor before the formation of the microlens (a material of the solid-state image sensor) can be used as the substrate. For example, it is possible to obtain a solid-state image sensor by forming a microlens on a planarization layer that forms the material of the solid-state image sensor.

Further, any one of a positive type-photosensitive resin and a negative type-photosensitive resin can be used as a photosensitive resin constituting the photosensitive resin layer. However, the positive type-photosensitive resin is preferable. For example, a phenolic epoxy resin, an acrylic resin, polyimide, or cycloolefin can be used as the positive type-photosensitive resin. Specifically, MFR401 (manufactured by JSR Corporation) or T-HMR P11 (manufactured by Tokyo Ohka Kogyo Co., Ltd.) can be used as the positive type-photosensitive resin. Meanwhile, for example, an acrylic resin can be used as the negative type-photosensitive resin. Specifically, PAK-01 (manufactured by TOAGOSEI Co., Ltd.) or NIP-K (manufactured by Zen Photonics Co., Ltd.) can be used as the negative type-photosensitive resin.

A method for forming the photosensitive resin layer on the substrate is not particularly limited. However, specifically, a spin coating method and the like can be used.

In addition, the thickness of the photosensitive resin layer differs depending on the application of the microlens and other factors. In general, the thickness of the photosensitive resin layer is in the range of 0.1 μm to 100 μm.

(2) Basic Shape Forming-Exposure Process

The basic shape forming-exposure process according to this embodiment will be described below. The basic shape forming-exposure process is a process for performing exposure to the above-mentioned photosensitive resin layer by using a microlens basic shape-forming mask.

As long as a desired microlens can be obtained by the combination of a microlens-shape-adjusting mask to be described below and the microlens basic shape-forming mask, the microlens basic shape-forming mask used in this embodiment is not particularly limited. Specifically, for example, a gray-scale mask, which has transmittance distribution rotationally symmetry to a central position of a unit cell (rotationally symmetrical gray-scale mask), can be used as the microlens basic shape-forming mask.

In general, a rotationally symmetrical gray-scale mask for a positive type-photosensitive resin layer (may referred to as "for a positive type") or a rotationally symmetrical gray-scale mask for a negative type-photosensitive resin layer (may referred to as "for a negative type") is selected depending on the kind of the above-mentioned photosensitive resin layer.

Figure 4A:
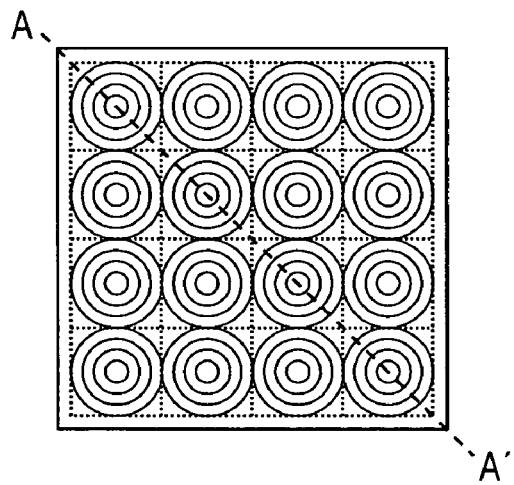
FIGS. 4A to 4D are views explaining a rotationally-symmetrical gray-scale mask.
Figure 4B:
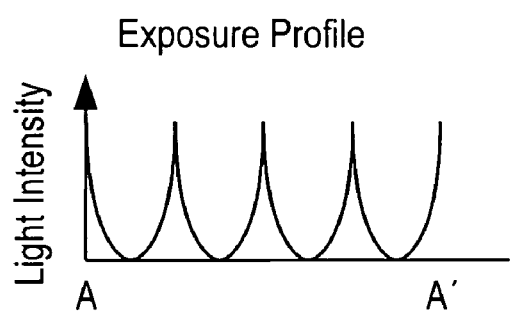

FIG. 4A is a schematic plan view of a rotationally symmetrical gray-scale mask for a positive type. The rotationally symmetrical gray-scale mask has light shielding properties which increase toward a central position of a unit cell. Since the positive type-photosensitive resin layer is decomposed by the exposure, it is possible to form a basic shape of a microlens by using the above-mentioned gray-scale mask. FIG. 4B is a view showing the exposure profile in a cross-sectional view taken along a line A-A' of FIG. 4A.

Figure 4C:
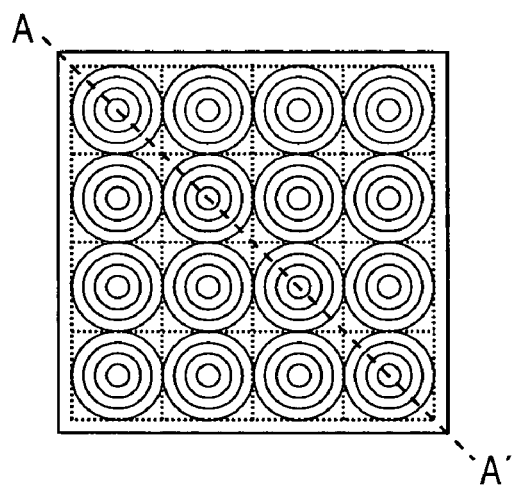
Figure 4D:
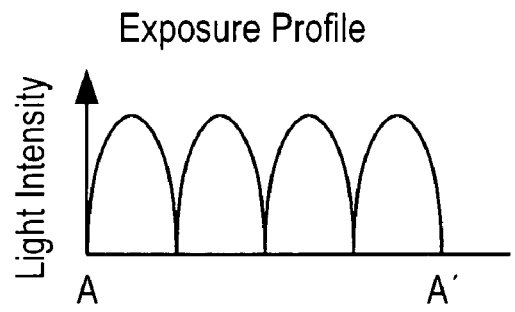

Meanwhile, FIG. 4C is a schematic plan view of an example of a rotationally symmetrical gray-scale mask for a negative type. This rotationally symmetrical gray-scale mask has light shielding properties which decrease toward a central position of a unit cell. Since the negative type-photosensitive resin layer is cured by exposure, it is possible to form a basic shape of a microlens by using the above-mentioned gray-scale mask. FIG. 4D is a view showing the exposure profile in a cross-sectional view taken along a line A-A' of FIG. 4C.

Further, as long as light used in the exposure is light capable of decomposing the positive type-photosensitive resin layer or light capable of curing the negative type-photosensitive resin layer, the light used in the exposure is not particularly limited and the same light as the light used in exposing general photosensitive resins can be used. For example, a g-ray (436 nm) and i-ray (365 nm) of a mercury lamp, KrF excimer laser (248 nm), or ArF excimer laser (193 nm) can be used to perform the exposure.

Furthermore, two exposure processes of the basic shape forming-exposure process and the deforming-exposure process are performed in this embodiment. A ratio between the amount of exposure light of the basic shape forming-exposure process and that of the deforming-exposure process differs depending on such as the kind of a mask or a resist to be used. For example, when the amount of exposure light of the basic shape forming-exposure process is assumed as 100, the amount of exposure light of the deforming-exposure process is preferably in the range of 50 to 100, and more preferably in the range of 70 to 80.

The amount of exposure light of the basic shape forming-exposure process is not particularly limited. However, it is preferably in the range of, for example, 50 to 100 mJ/cm$^2$, and more preferably in the range of 65 to 75 mJ/cm$^2$.

The sum of the amount of exposure light of the basic shape forming-exposure process and the amount of exposure light of the deforming-exposure process differs depending on the kind of a mask to be used or other factors. For example, the sum of the amount of exposure light is preferably in the range of 100 to 150 mJ/cm$^2$, and more preferably in the range of 115 to 135 mJ/cm$^2$.

(3) Deforming-Exposure Process

The deforming-exposure process according to this embodiment will be described below. The deforming-exposure process according to this embodiment is a process for performing exposure, which has a unit cell-exposure profile different from the exposure performed in the above-mentioned basic shape forming-exposure process, to the photosensitive resin layer by using a microlens-shape-adjusting mask after the basic shape forming-exposure process.

In this embodiment, the "unit cell-exposure profile" shows light intensity distribution in a unit cell. The "exposure that has a unit cell-exposure profile different from the exposure performed in the basic shape forming-exposure process" is:

exposure that has a unit cell-exposure profile having different shape from the shape of the unit cell-exposure profile of the basic shape forming-exposure process; and designates exposure, in which the unit cell-exposure profiles of the basic shape forming-exposure process and the deforming-exposure process overlap each other, but are not rotationally symmetry to a central position of a unit cell. Specifically, it designates exposure where the shapes of the unit cell-exposure profiles of unit cells "α" are different from each other as shown in FIGS. 3B and 3D, and the unit cell-exposure profiles of unit cells "α" overlap each other, but are not rotationally symmetry to a central position (center line "X") of a unit cell as shown in FIG. 3E.

As long as the exposure which has a unit cell-exposure profile different from the exposure performed in the basic shape forming-exposure process can be performed, the microlens-shape-adjusting mask used in this embodiment is not particularly limited.

It is preferable in this embodiment that a microlens-shape-adjusting mask for a positive type or a microlens-shape-adjusting mask for a negative type be selected depending on the kind of the above-mentioned photosensitive resin layer.

The microlens-shape-adjusting mask for a positive type generally has a number of opening parts at position where the positive type-photosensitive resin layer is to be further decomposed.

Each of the opening parts may have such as a rectangular shape, a polygonal shape, a circular shape, or an elliptical shape. Among them, it is preferable that each of the opening parts have a rectangular shape. Further, as long as the exposure, which has a unit cell-exposure profile different from the exposure performed in the basic shape forming-exposure process, can be performed, the positions of the opening parts are not particularly limited.

Figure 5A:
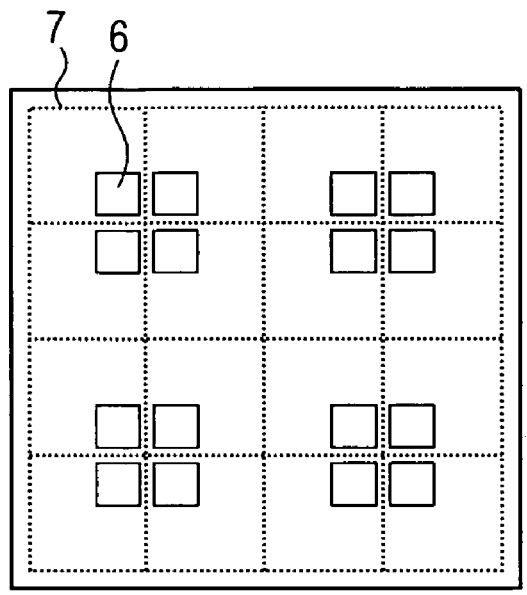
FIGS. 5A and 5B are views each explaining a microlens-shape-adjusting mask for a positive type.
Figure 5B:
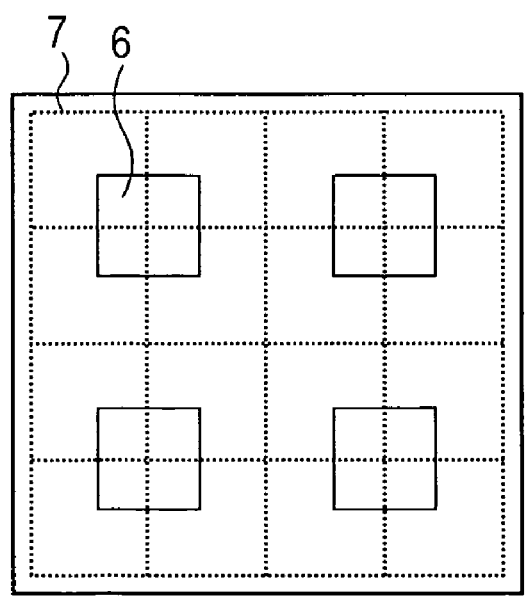

In addition, the microlens-shape-adjusting mask for a positive type may have an opening part in each of unit cells, or may have an opening part over a plurality of unit cells. The microlens-shape-adjusting mask for a positive type, which has an opening part in each of unit cells, can be specifically exemplified by a microlens-shape-adjusting mask where each of the unit pixels 7 has an opening part 6 as shown in FIG. 5A. Each of the unit pixels 7 may have a plurality of opening parts 6. The microlens-shape-adjusting mask for a positive type, which has an opening part over a plurality of unit cells, can be specifically exemplified by a microlens-shape-adjusting mask where a plurality of unit cells 7 have an opening part 6 as shown in FIG. 5B.

Further, the microlens-shape-adjusting mask for a positive type may have opening parts having gradation properties, or may have opening parts not having gradation properties. However, it is preferable in this embodiment that the microlens-shape-adjusting mask for a positive type has opening parts not having gradation properties because it can be easily manufactured.

Figure 6A:
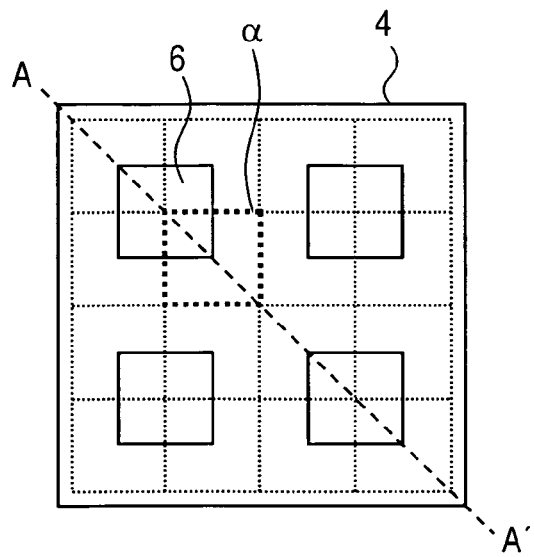
FIGS. 6A to C are views explaining defocus exposure.
Figure 6B:
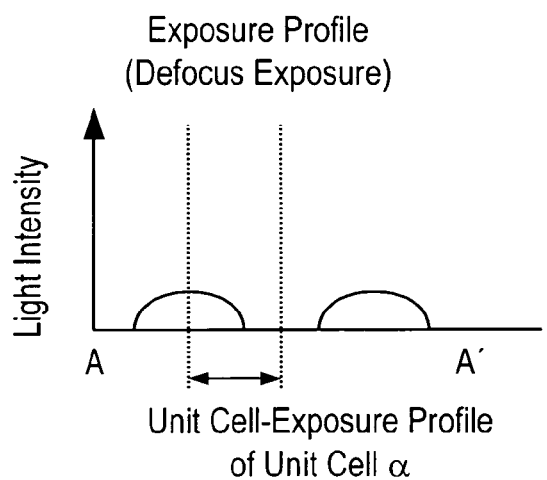
Figure 6C:
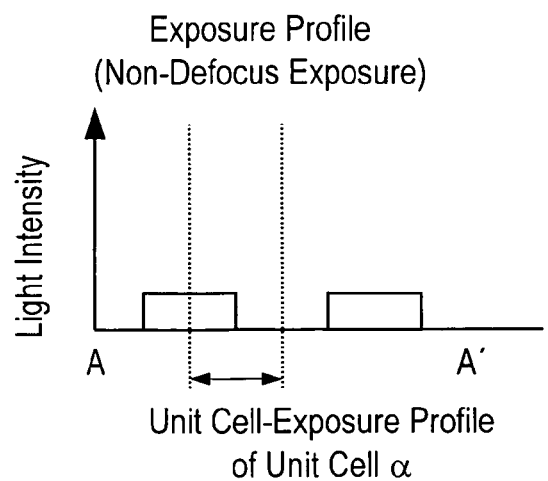

Further, when the microlens-shape-adjusting mask for a positive type has opening parts not having gradation properties, it is preferable in this embodiment that the exposure performed in the deforming-exposure process be defocus exposure. This is because it is possible to obtain a microlens having a smooth shape. In this embodiment, the "defocus exposure" means exposure that is performed after defocusing which can provide a smooth exposure profile. Specifically, when a microlens-shape-adjusting mask 4 for a positive type has rectangular opening parts 6 which do not have gradation properties as shown in FIG. 6A, a unit cell-exposure profile of a unit cell "α" becomes smooth as shown in FIG. 6B by performing defocus exposure. Meanwhile, when the defocus exposure is not performed, a unit cell-exposure profile of a unit cell "α" has a stepped shape as shown in FIG. 6C.

Further, a defocusing distance of the defocus exposure is not particularly limited. It can be in the range of, for example, 5 μm to 15 μm, and preferably in the range of 7 μm to 12 μm.

Figure 7A:
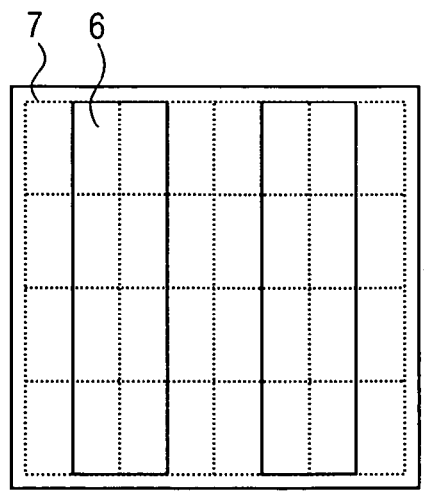
FIGS. 7A and B are views each illustrating a microlens-shape-adjusting mask for a positive type, in which opening parts do not have gradation properties.
Figure 7B:
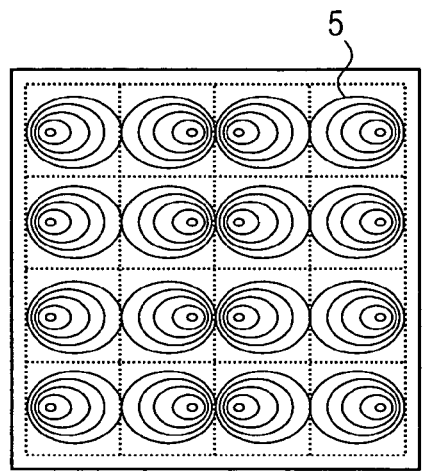
Figure 8:
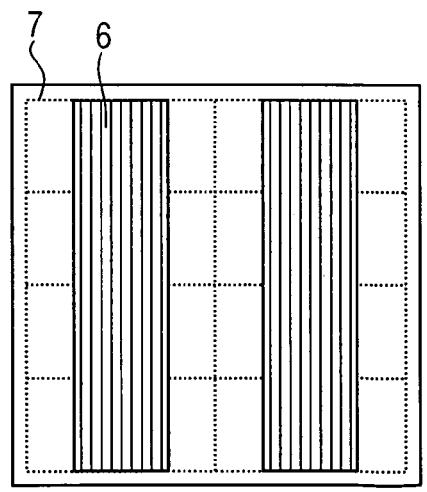
FIG. 8 is a view illustrating a microlens-shape-adjusting mask for a positive type, in which opening parts have gradation properties.

The microlens-shape-adjusting mask for a positive type, which has opening parts which do not have gradation properties, has been shown in FIG. 6A. Alternatively, for example, a rectangular opening part 6 not having gradation properties can be formed over a plurality of unit cells 7 as shown in FIG. 7A can be cited. Meanwhile, a microlens 5 shown in FIG. 7B can be formed by: forming a positive type-photosensitive resin layer on a substrate, performing the basic shape forming-exposure process by using a rotationally symmetrical gray-scale mask shown in FIG. 4A, and carrying out the deforming-exposure process for performing defocus exposure by using the microlens-shape-adjusting mask shown in FIG. 7A. In the case of using the microlens-shape-adjusting mask for a positive type, which has opening parts having gradation properties, it is possible to obtain the same effect as the above-mentioned defocus exposure by performing a general exposure. The microlens-shape-adjusting mask for a positive type, which has opening parts having gradation properties, can be specifically exemplified by a microlens-shape-adjusting mask where a rectangular opening part 6 having gradation properties is formed over a plurality of unit cells 7 as shown in FIG. 8.

Meanwhile, a microlens-shape-adjusting mask for a negative type generally has a number of light shielding portions at positions where a negative type-photosensitive resin layer is desired not to be further cured. Since the shape of the light shielding portions is similar to the shape of the above-mentioned opening parts of the microlens-shape-adjusting mask for a positive type, the descriptions thereof will be not repeated herein. Further, regions (light transmitting portions) other than the light shielding portions may have gradation properties, or may not have gradation properties. Since the description of the gradation properties of the light transmitting portions is similar to the description of the gradation properties of the above-mentioned opening parts of the microlens-shape-adjusting mask for a positive type, the descriptions thereof will be not repeated herein.

Since the light used in the exposure is similar to the light used in the above-mentioned basic shape forming-exposure process, the descriptions thereof will be not repeated herein.

Two exposure processes of the basic shape forming-exposure process and the deforming-exposure process have been performed in this embodiment. However, an exposure process for finely adjusting the shape of the microlens or other process can be further performed.

(4) Developing Process

A developing process according to this embodiment will be described below. The developing process according to this embodiment is a process for developing the photosensitive resin layer with a developer, after the above-mentioned deforming-exposure process.

The developer used in this embodiment is not particularly limited, and it is preferable that the developer is appropriately selected depending on the kind of the photosensitive resin layer to be used or other factors. Specifically, an alkali developer or an organic solvent developer can be used for example in this embodiment.

A method for developing the photosensitive resin layer is not particularly limited in this embodiment. However, for example, a dipping method, a spraying method, or a puddling method can be used. Specifically, a puddling method is preferable.

(5) Microlens

A microlens manufactured by the method according to this embodiment will be described below. As long as the maximum thickness position is different from the gravity center position, the microlens manufactured by the method according to this embodiment is not particularly limited. Specifically, the maximum thickness position of the microlens is spaced apart from the gravity center position of the microlens by a distance that corresponds to preferably 2% or more of the diameter of the microlens, and more preferably 5% or more of the diameter of the microlens. This is because it enables to obtain a solid-state image sensor having excellent light collection efficiency. The "diameter of the microlens" designates a length of a unit cell in a diagonal direction. For example, it is preferable that the diameter of the microlens be 10 μm or less.

It is preferable that a gap do not exist between adjacent microlenses. This is because enables to improve light collection efficiency.

The maximum thickness of the microlens differs depending on, such as pixel size, the shape of the microlens, and a distance between the microlens and a light receiving element. Specifically, it is preferable that the maximum thickness of the microlens be in the range of 0.2 μm to 1.5 μm.

The kind of the microlens is not particularly limited, and can be, for example, a sphere type microlens or a gradient index microlens.

2. Second Embodiment

A method for manufacturing a microlens according to a second embodiment of the present invention will be described below. In the method for manufacturing a microlens according to a second embodiment, a deforming-exposure process is performed first and a basic shape forming-exposure process is performed subsequently. That is, the method for manufacturing the microlens according to the second embodiment comprises: a deforming-exposure process for performing exposure, which has a unit cell-exposure profile different from the exposure performed in a basic shape forming-exposure process to be described below, to a photosensitive resin layer formed a substrate, by using a microlens-shape-adjusting mask, and a basic shape forming-exposure process for performing exposure to the photosensitive resin layer by using a microlens basic shape-forming mask after the basic shape forming-exposure process, wherein a microlens, which has a maximum thickness position different from a gravity center position, is formed.

Figure 9A:
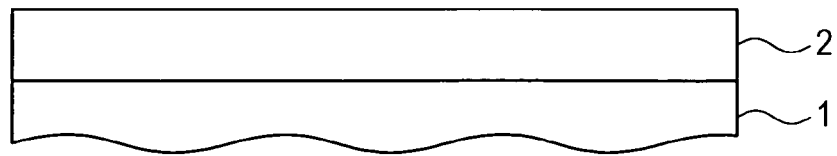
FIGS. 9A to 9D are process drawings showing a method for manufacturing a microlens according to another embodiment of the present invention.
Figure 9B:
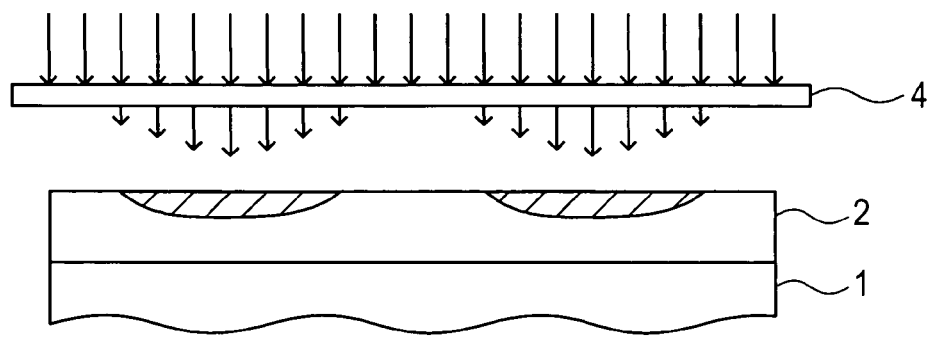
Figure 9C:
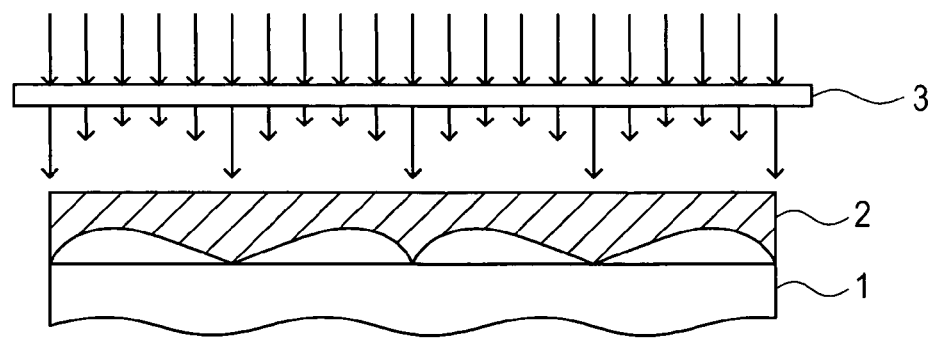
Figure 9D:

The method for manufacturing the microlens according to the second embodiment will be described below with reference to the drawings. FIGS. 9A to 9D are process drawings showing the method for manufacturing the microlens according to the second embodiment. The method shown in FIGS. 9A to 9D comprises: a photosensitive resin layer forming process for forming a positive type-photosensitive resin layer 2 on a substrate 1 as shown in FIG. 9A; a deforming-exposure process for performing partial-exposure to the photosensitive resin layer 2 by using a microlens-shape-adjusting mask 4 as shown in FIG. 9B; and a basic shape forming-exposure process for performing exposure by using a gray-scale mask, which has transmittance distribution rotationally symmetry to a central position of a unit cell, as a microlens basic shape-forming mask 3 as shown in FIG. 9C. Then, a developing process is performed. As a result, as shown in FIG. 9D, it is possible to obtain a microlens 5 that has a maximum thickness position different from a gravity center position.

The method for manufacturing the microlens according to this embodiment generally comprises: a photosensitive resin layer forming process for forming a photosensitive resin layer on a substrate, a deforming-exposure process, a basic shape forming-exposure process, and a developing process. The processes are same as those explained in the first embodiment and explanations thereof are not repeated herein. Further, various characteristics and other factors of the obtained microlens are same as those mentioned in the first embodiment and explanations thereof are not repeated herein.

The present invention is not limited to the above-described embodiments. The above embodiments are exemplary, so that any of those having a construction substantially identical to the technical idea described in the claims of the present invention and exhibiting similar functions and effects will be comprised within the technical scope of the present invention.

EXAMPLES

The present invention will be described in more detail below with reference to the following example.

Example

An example will be described with reference to a case where a positive resist was used as a photosensitive resin.

First, a phenol epoxy-based positive resist was applied by a spin coating method so as to have a thickness of about 1.0 μm, and dried under appropriate conditions.

Figure 10:
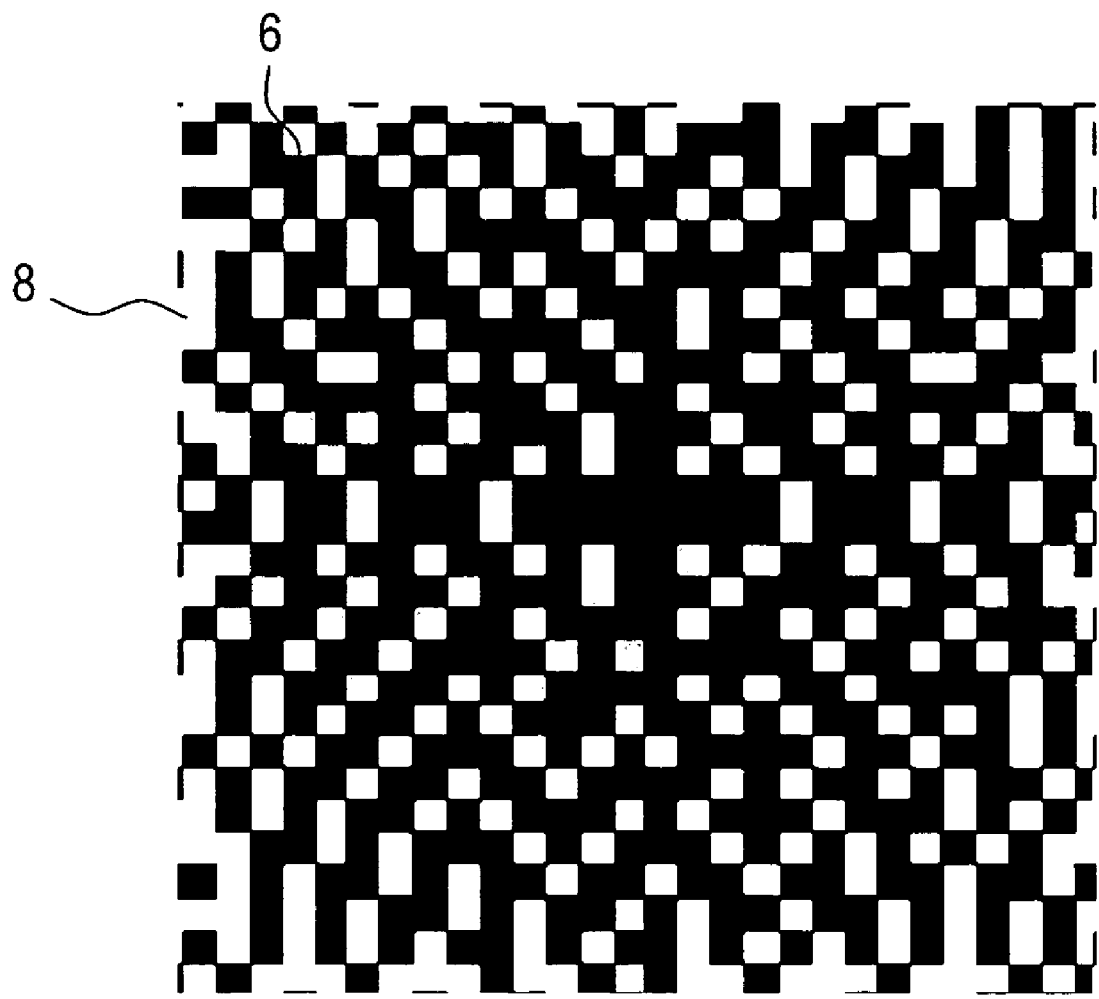
FIG. 10 is a view showing a gray-scale mask used in an example.

Next, a basic shape forming exposure was performed. FIG. 10 shows patterns of unit cells of a photomask used in the exposure. The reference numeral 6 denotes a light shielding portion, and the reference numeral 8 denotes an opening part. Transmittance distribution was controlled by the arrangement of fine dot patterns, which are not resolved in an exposure wavelength, so as to be rotationally symmetrical. Exposure was performed using an I-ray stepper so as to have the amount of exposure light of about 100 mJ/cm$^2$ and a defocusing distance of about 0 μm.

Then, a deforming exposure was performed. The exposure was performed using a photomask pattern, which has one opening part 6 per four unit cells 7 as shown in FIG. 5B. The amount of exposure light was about 50 mJ/cm$^2$, and a defocusing distance was about 10 μm. An exposure profile, which is rotationally asymmetrical as shown in FIG. 3E, was obtained by performing a first exposure process (basic shape forming exposure) and a second exposure process (deforming exposure).

Figure 11A:
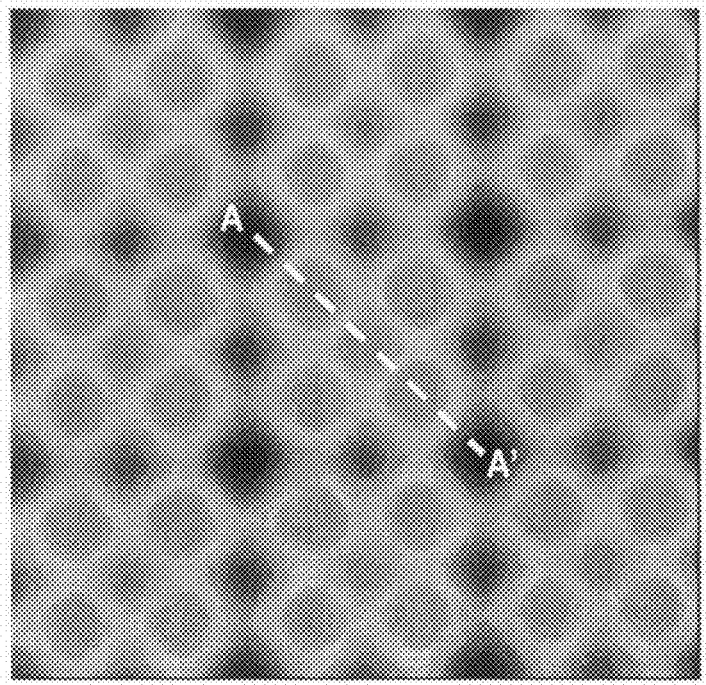
FIGS. 11A and 11B are views each showing an AFM observed image of a microlens manufactured in the example.
Figure 11B:
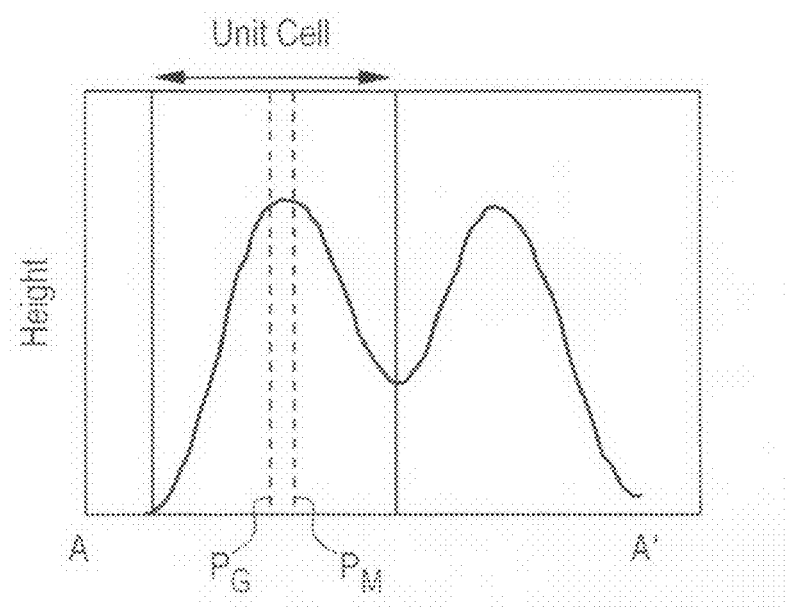

After that, a microlens, which has an asymmetric shape, was obtained by performing a development under appropriate conditions. FIGS. 11A and B show AFM observed images of the microlens manufactured in this example. FIG. 11A is a top view, and FIG. 11B is a view showing the profile in a cross-sectional view taken along a line A-A' of FIG. 11A. It is understood that a microlens has a smooth shape and $P_M$ not corresponding to $P_G$.

As a result, it was possible to confirm as follows: a microlens having a smooth shape, where a maximum thickness position is different from a gravity center position, can be easily formed by the method for manufacturing a microlens according to the present invention.

What is claimed is:

1. A method for manufacturing a microlens comprising processes of:
   a basic shape forming-exposure process for performing exposure by using a microlens basic shape-forming mask to a photosensitive resin layer formed on a substrate; and
   a deforming-exposure process for performing exposure, with a unit cell-exposure profile different from that of the exposure performed in the basic shape forming-exposure process, to the photosensitive resin layer by using a microlens-shape-adjusting mask,
   wherein a microlens, having a maximum thickness position different from a gravity center position is formed,
   the microlens-shape-adjusting mask is a mask provided with an opening part not having gradation properties, and the exposure performed in the deforming-exposure process is defocus exposure.

2. The method for manufacturing a microlens according to claim 1, wherein the microlens basic shape-forming mask is a gray-scale mask, which has transmittance distribution rotationally symmetry to a central position of a unit cell.

* * * * *